(12) United States Patent  (10) Patent No.: US 7,763,497 B2
Neaves  (45) Date of Patent: Jul. 27, 2010

(54) STRUCTURE AND METHOD FOR FORMING A CAPACITIVELY COUPLED CHIP-TO-CHIP SIGNALING INTERFACE

(75) Inventor: Philip Neaves, Surrey (GB)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 12/323,213

(22) Filed: Nov. 25, 2008

(65) Prior Publication Data

US 2009/0072389 A1    Mar. 19, 2009

Related U.S. Application Data

(62) Division of application No. 10/779,305, filed on Feb. 13, 2004, now Pat. No. 7,462,935.

(30) Foreign Application Priority Data

Oct. 13, 2003  (GB)  .................... 0323992.8

(51) Int. Cl.
    *H01L 21/50*  (2006.01)
(52) U.S. Cl. ................ 438/109; 438/118; 257/E21.507
(58) Field of Classification Search .................. 257/725
    See application file for complete search history.

(56) References Cited

U.S. PATENT DOCUMENTS

| 3,782,504 A | 1/1974 | Billmaier et al. | .......... 187/29 R |
| 4,280,221 A | 7/1981 | Chun et al. | .................... 375/17 |
| 5,124,660 A | 6/1992 | Cilingiroglu | ................ 324/538 |
| 5,673,130 A | 9/1997 | Sundstrom et al. | .......... 359/158 |
| 5,786,979 A | 7/1998 | Douglass | .................... 361/328 |
| 5,818,112 A | 10/1998 | Weber et al. | ................ 257/777 |
| 5,942,911 A | 8/1999 | Motika et al. | ................ 324/769 |

(Continued)

FOREIGN PATENT DOCUMENTS

EP    0 277 764 A3    1/1988

(Continued)

OTHER PUBLICATIONS

"International Technology Roadmap for Semiconductors", Assembly and Packaging, 2001, pp. 1-21.

(Continued)

*Primary Examiner*—Stephen W Smoot
(74) *Attorney, Agent, or Firm*—Dorsey & Whitney LLP

(57) ABSTRACT

A system and method for providing capacitively-coupled signaling in a system-in-package (SiP) device is disclosed. In one embodiment, the system includes a first semiconductor device and an opposing second semiconductor device spaced apart from the first device, a dielectric layer interposed between the first device and the second device, a first conductive pad positioned in the first device, and a second conductive pad positioned in the second device that capacitively communicate signals from the second device to the first device. In another embodiment, a method of forming a SiP device includes forming a first pad on a surface of a first semiconductor device, forming a second pad on a surface of a second semiconductor device, and interposing a dielectric layer between the first semiconductor device and the second semiconductor device that separates the first conductive signal pad and the second conductive signal pad.

22 Claims, 4 Drawing Sheets

U.S. PATENT DOCUMENTS

| | | | |
|---|---|---|---|
| 5,974,464 A | 10/1999 | Shin et al. | 709/231 |
| 6,087,842 A | 7/2000 | Parker et al. | 324/763 |
| 6,188,232 B1 | 2/2001 | Akram et al. | 324/755 |
| 6,242,941 B1 | 6/2001 | Vest et al. | 326/26 |
| 6,285,201 B1 | 9/2001 | Farnworth et al. | 324/755 |
| 6,310,494 B1 | 10/2001 | Ehben et al. | 326/82 |
| 6,357,025 B1 | 3/2002 | Tuttle | 714/724 |
| 6,368,930 B1 | 4/2002 | Enquist | 438/320 |
| 6,396,292 B2 | 5/2002 | Hembree et al. | 324/755 |
| 6,407,566 B1 | 6/2002 | Brunelle et al. | 324/758 |
| 6,425,107 B1 | 7/2002 | Caldara et al. | 714/759 |
| 6,490,188 B2 | 12/2002 | Nuxoll et al. | 365/63 |
| 6,496,889 B1 | 12/2002 | Perino et al. | 710/110 |
| 6,500,696 B2 | 12/2002 | Sutherland | 438/109 |
| 6,563,133 B1 | 5/2003 | Tong | 257/52 |
| 6,563,299 B1 | 5/2003 | Van Horn et al. | 324/158.1 |
| 6,620,638 B1 | 9/2003 | Farrar | 438/14 |
| 6,625,073 B1 | 9/2003 | Beffa | 365/201 |
| 6,690,309 B1 | 2/2004 | James et al. | 341/102 |
| 6,714,031 B2 | 3/2004 | Seki | 324/763 |
| 6,859,883 B2 | 2/2005 | Svestka et al. | 713/320 |
| 6,937,067 B2 | 8/2005 | Neaves | 326/93 |
| 7,053,466 B2 * | 5/2006 | Prokoflev et al. | 257/662 |
| 7,075,330 B2 | 7/2006 | Neaves | 326/26 |
| 7,112,980 B2 | 9/2006 | Neaves et al. | 324/765 |
| 7,183,790 B2 | 2/2007 | Neaves et al. | 324/765 |
| 7,274,204 B2 | 9/2007 | Neaves et al. | 324/765 |
| 7,274,205 B2 | 9/2007 | Neaves et al. | 324/765 |
| 7,276,928 B2 | 10/2007 | Neaves et al. | 324/765 |
| 7,352,201 B2 | 4/2008 | Neaves et al. | 324/765 |
| 2001/0039075 A1 | 11/2001 | Doyle et al. | 438/107 |
| 2001/0054908 A1 | 12/2001 | Farnworth et al. | 324/755 |
| 2005/0002448 A1 | 1/2005 | Knight et al. | 257/48 |
| 2005/0077546 A1 | 4/2005 | Neaves | 257/210 |
| 2005/0280444 A1 | 12/2005 | Neaves | 326/93 |

FOREIGN PATENT DOCUMENTS

| | | |
|---|---|---|
| EP | 0 366 263 A3 | 5/1990 |
| EP | 0 492 806 A3 | 11/1991 |
| EP | 0 805 356 A3 | 4/1998 |
| GB | 2 353 401 A | 2/2001 |
| GB | 2 353 402 A | 2/2001 |
| GB | 2 402 026 A | 11/2004 |
| GB | 2 405 215 A | 5/2005 |
| GB | 2 407 207 A | 5/2005 |
| WO | WO 0215185 A1 | 2/2002 |

OTHER PUBLICATIONS

Karnezos, M. et al., "System in a Package (SiP) Benefits and Technical Issues", in *Proceedings of* APEX, San Diego, California, 2002, 7 pages.

Mick, S. et al., "4Gbps High-Density AC Coupled Interconnection", Department of Electrical and Computer Engineering North Carolina State University, IEEE Custom Integrated Circuits Conference, May 12-16, 2002, pp. 133-140.

"Rapidly Advancing System-in-Package Fabrication Technology", vol. 20, No. 3, 2002, pp. 3-11.

Scanlan, C.M. et al., "System-In-Package Technology, Application and Trends", 2001 Proceedings of SMTA International, Rosemont, Illinois, pp. 764-773.

Wang, M. et al., "Configurable Area-IO Memory for System-In-A-Package (SiP)", 27th European Solid-State Circuits Conference, Sep. 2001, 4 pages.

* cited by examiner

STRUCTURE AND METHOD FOR FORMING A CAPACITIVELY COUPLED CHIP-TO-CHIP SIGNALING INTERFACE

CROSS-REFERENCE TO RELATED APPLICATIONS

This application is a divisional of U.S. patent application Ser. No. 10/779,305, filed Feb. 13, 2004, now U.S. Pat. No. 7,462,935, which claims the benefit of United Kingdom Patent Application No. 0323992.8, filed Oct. 13, 2003.

The entire disclosure of these prior applications, from which a copy of the oath or declaration is supplied, is considered to be part of the disclosure of the instant application and is hereby incorporated by reference therein.

TECHNICAL FIELD

The present invention is directed to a system-in-package device, and more particularly, to a system and method for providing capacitively-coupled signaling in a system-in-package device.

BACKGROUND OF THE INVENTION

Traditional semiconductor integrated circuit technology is commonly used to integrate various electronic circuits onto a common semiconductor substrate to form an electronic system, or subsystem. The traditional approach to integrating circuits into a system often has process, manufacturing and design limitations which present difficulties when certain electronic circuits are integrated onto a common semiconductor substrate. A recently developed integration technology commonly referred to as system-in-package (SiP) technology attempts to overcome at least some of the limitations of traditional semiconductor integration methods by interconnecting multiple discrete and individually fabricated semiconductor systems on a common substrate and encapsulating the complete system in a common package. Accordingly, SiP allows a variety of device technologies to be integrated into a single package that would otherwise be difficult and expensive to fabricate using traditional integration methods. For example, SiP technology has been successfully applied in mixed signal applications, where analog and digital components are integrated onto the same chip. Such applications typically present noise immunity difficulties, since digital circuit switching commonly injects noise into the common substrate, which may corrupt sensitive analog signals. As the size of features in devices decreases and clock frequencies increase, the amount of substrate noise created by digital switching has increased dramatically.

As previously mentioned, the multiple discrete systems of a SiP are electrically coupled together to form a system and, as is well known in the art of digital electronics, many of the multiple systems communicate with one another by transmitting digital information in the form of electrical signals. Typically, even analog-based systems in the SiP generally have analog signals converted into the digital domain. The electrical signals transmitted between the multiple systems generally represent a serial data stream where the data is represented by binary states having discrete levels of amplitude or phase, as well known. Multiple electrical signals are transmitted in parallel to transmit data of a data width, with each signal representing one bit of the width of data. In transmitting the data, the electrical signal may be distorted by various phenomena, such as noise, signal strength variations, phase shift variations, and the like. Moreover, multiple individual devices generally interact in a SiP, and the various devices may operate at different voltage levels that may cause undesired electrical currents to flow from one system to another, which generally contributes to excess power consumption. Additionally, the undesired current may be sufficiently large to damage to the devices.

Consequently, SiP devices have employed capacitively coupled signaling between the multiple systems to filter noise from the electrical signals and also prevent current flow between devices operating in different voltage domains. FIG. 1 illustrates a capacitively coupled signaling system having a capacitively coupled data bus 100 that is n-bits wide that may be used to transmit data signals D_OUT0-D_OUTn. The data bus 100 includes output driver circuits, or transmitters 102 of the transmitting device capacitively coupled through capacitors 106 to input buffer circuits, or receivers 104 at the receiving device. The received data has been represented by the received data signals D_IN0-DINn. As shown in FIG. 1, the data bus 100 has been illustrated as a uni-directional data bus, with the transmitters 102 representing a transmitting device and the receivers 104 representing a receiving device. However, it will be appreciated that the data bus 100 has been illustrated in this manner by way of example, and that the data bus 100 can be a bi-directional data bus as well.

Lower power may be consumed when utilizing capacitively coupled signaling since there is only minimal leakage current between devices. Capacitively coupled signaling is also insensitive to voltage domains, allowing operation without the need for level shifting. Specifically, a capacitively coupled signaling system permits an AC component of a signal to be transferred, while blocking a DC component of the signal. Additionally, circuits designed for protection from electrostatic discharge (ESD) are no longer necessary where the signaling is entirely contained within the SiP device. Circuits dedicated to ESD protection, usually consisting of diode networks in various configurations, add complexity to the terminal regions of a device, and compete for "real estate" on the device substrate. Load requirements on output circuitry can also be relaxed compared with conventional off-die signaling because the need to drive signals external to the device package are eliminated for those signals that remain internal to the SiP device.

In forming capacitively coupled signaling systems, discrete passive components have been used to connect the signal terminals of the different systems, such as discrete capacitors, resistors, and the like. However, when discrete components are used, some of the foregoing advantages associated with a capacitively coupled signaling system are reduced. For example, when a signal pad is wire bonded to a discrete passive component that further extends to another signal pad, parasitic effects are generally introduced. Additionally, when several discrete components are included in a SiP, an increased form factor is generally developed, since the additional components must be accommodated. Passive components can be integrated into each discrete system, thereby avoiding issues with having additional passive components included in the SiP, but even when the passive components are integrated into the SiP, the need to have wires coupling the signal pads of the discrete systems cannot be avoided. As noted above, bonding wires can cause undesirable parasitic loading effects. Therefore, there is a need in the art for an alternative capacitively coupled signaling structure and a method for forming a capacitively coupled structure.

SUMMARY OF THE INVENTION

The present invention is directed to a system and method for providing capacitively-coupled signaling in a system-in-package (SiP) device. In one aspect, the SiP device includes a first semiconductor device and an opposing second semiconductor device spaced apart from the first semiconductor device, a dielectric layer interposed between the first semiconductor device and the second semiconductor device, a first conductive pad positioned in the first semiconductor device, and a second conductive pad positioned in the second semiconductor device that is configured to capacitively communicate signals from the second semiconductor device to the first semiconductor device. In another aspect, a method of forming a SiP device includes forming a first conductive signal pad on a surface of a first semiconductor device, forming a second conductive signal pad on a surface of a second semiconductor device, and interposing a dielectric layer between the first semiconductor device and the second semiconductor device that separates the first conductive signal pad and the second conductive signal pad.

DETAILED DESCRIPTION OF THE INVENTION

The present invention is generally directed to a system-in-package device, and more particularly, to a system and method for providing capacitively-coupled signaling in a system-in-package device. Many of the specific details of certain embodiments of the invention are set forth in the following description and in FIGS. 2-4 to provide a thorough understanding of such embodiments. One skilled in the art will understand, however, that the present invention may be practiced without several of the details described in the following description. Moreover, in the description that follows, it is understood that the figures related to the various embodiments are not to be interpreted as conveying any specific or relative physical dimension. Instead, it is understood that specific or relative dimensions related to the embodiments, if stated, are not to be considered limiting unless the claims specifically state otherwise.

Figure 1:
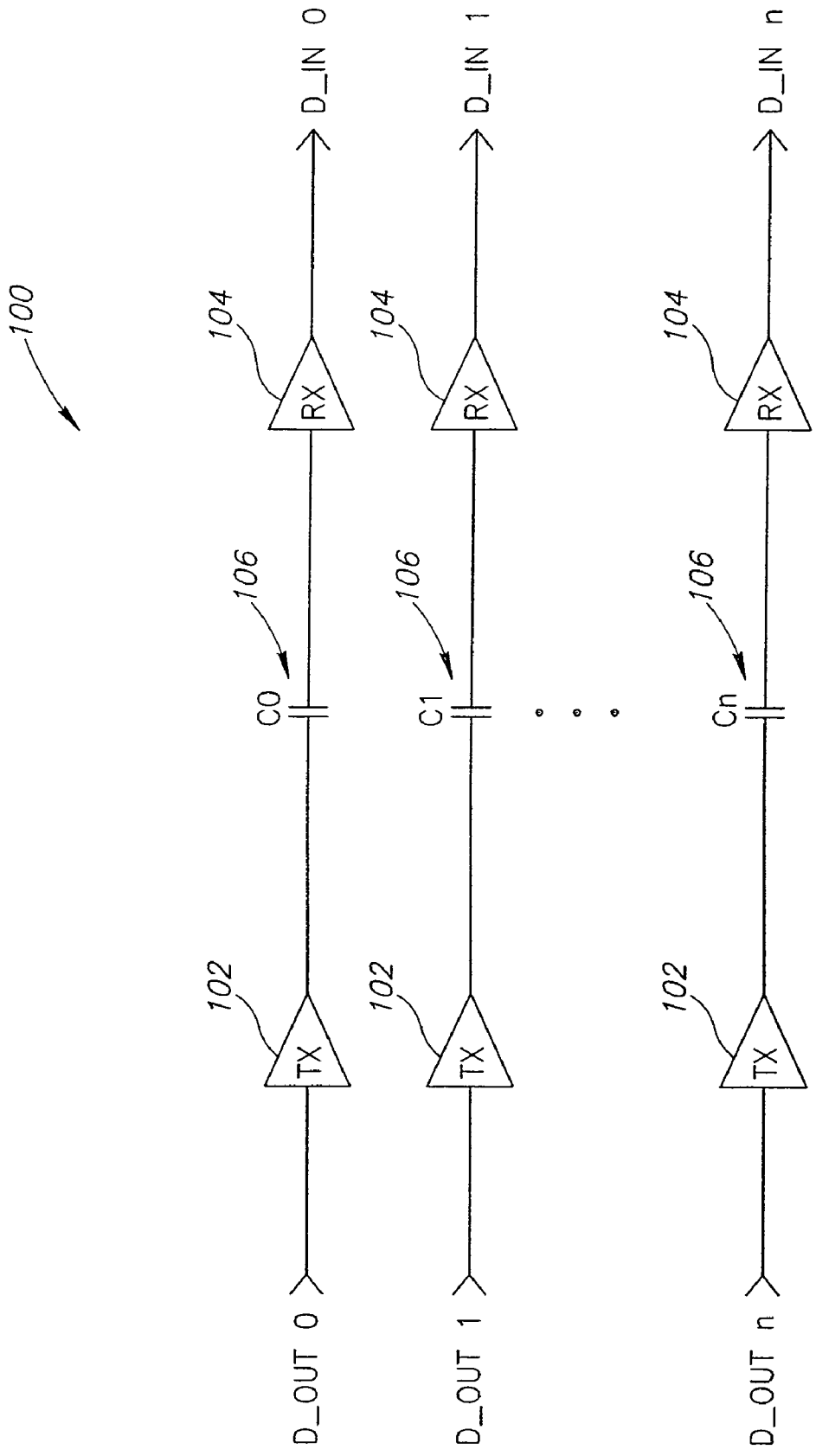
FIG. 1 is a schematic view of a capacitively coupled signaling system according to the prior art.
Figure 2:
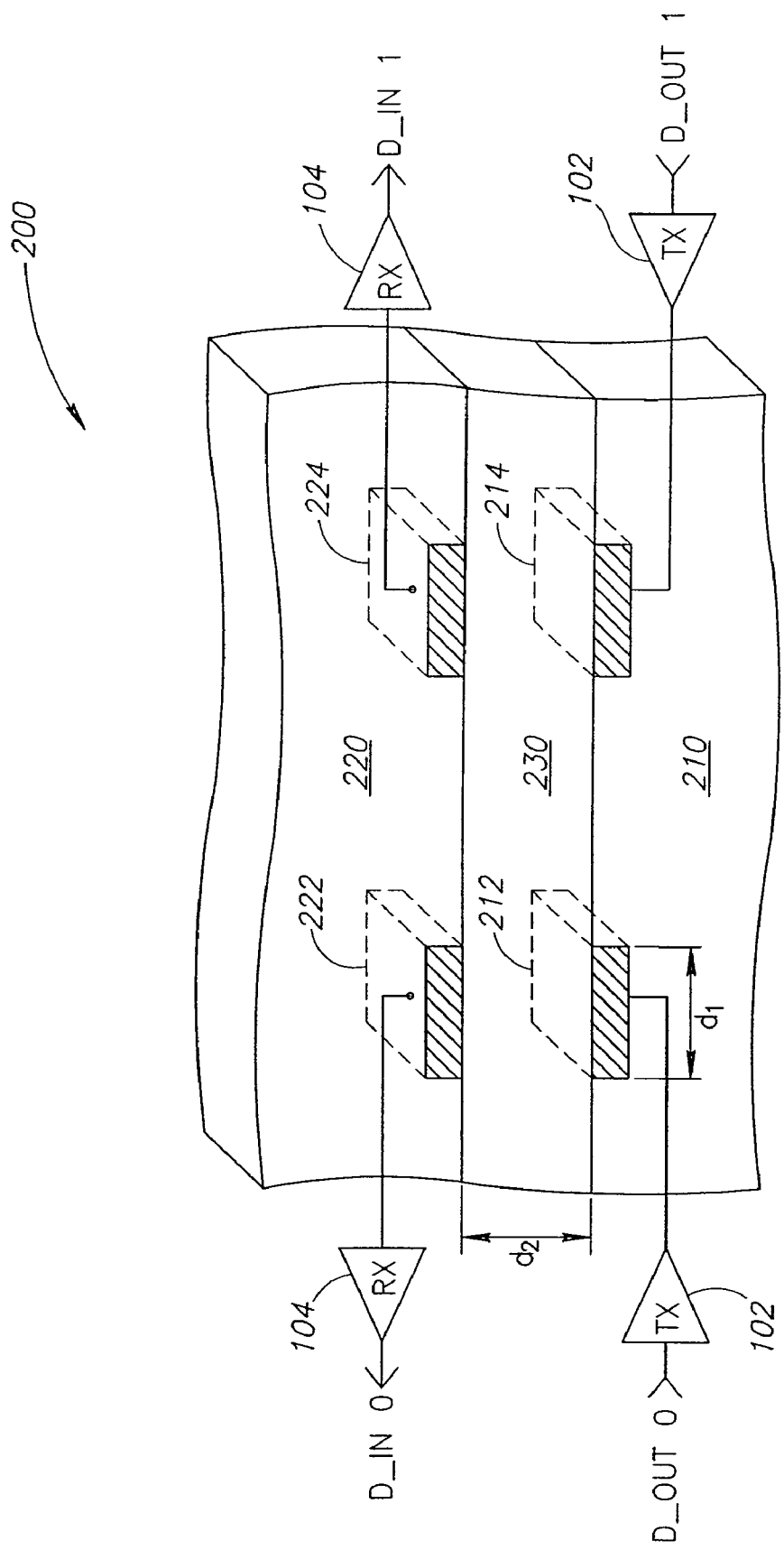
FIG. 2 is a partial isometric and cross-sectional view of a capacitively coupled SiP according to an embodiment of the invention.

FIG. 2 is a partial isometric and cross-sectional view of a capacitively coupled SiP 200 according to an embodiment of the invention. The SiP 200 includes a first semiconductor device 210 and a second semiconductor device 220 that is spaced apart from the first semiconductor device 210 by a dielectric layer 230. The first semiconductor device 210 includes a signal pad 212 that is coupled to the transmitter 102 that transmits a data signal D_OUT0 to the signal pad 212. The first semiconductor device 210 further includes a signal pad 214 that is coupled to the transmitter 102 that transmits a data signal D_OUT1 to the signal pad 214. In a similar manner, the second semiconductor device 220 includes a signal pad 222 that is coupled to the receiver 104 that transmits a data signal D_IN0 from the signal pad 222. The second semiconductor device 220 further includes a signal pad 224 that is coupled to the receiver 104 that transmits a data signal D_IN1 from the signal pad 224. The pads 212 and 222, and the pads 214 and 224 are positioned within the semiconductor devices 210 and 220 to permit the data signals to be exchanged between the devices 210 and 220 through the dielectric layer 230 by capacitive coupling. Although FIG. 2 illustrates only four signal pads that are configured to capacitively transfer signals between the first semiconductor device 210 and the second semiconductor device 220, it is understood that the capacitively coupled SiP 200 may include more than four similarly configured pads, or as few as two signal pads.

The signal pad 212 of the first semiconductor device 210 and the pad 222 of the second semiconductor device 220 are approximately mutually in alignment, as shown in FIG. 2, so that the capacitive coupling between the semiconductor devices 210 and 220 may be maximized. Similarly, the pads 214 and 224 are approximately mutually in alignment to maximize capacitive coupling between the semiconductor devices 210 and 220. One skilled in the art will readily appreciate that the pads 212 and 222 may be configured such that the pads 212 and 222 are only in relative proximity and still achieve capacitive coupling between the devices 210 and 220. In a similar manner, the pads 214 and 224 may also be configured so that the pads 214 and 224 are only relatively proximate to one another.

Still referring to FIG. 2, the dielectric layer 230 of the SiP 200 may be comprised of silicon dioxide, silicon nitride, or other alternative dielectric materials that are deposited on each of the first semiconductor device 210 and second semiconductor device 220. Alternately, and in a particular embodiment, the dielectric layer 230 may be comprised of a passivated layer formed on exposed surfaces of the first semiconductor device 210 and/or the second semiconductor device 220 during fabrication of the semiconductor devices 210 and 220. In either case, the dielectric layers formed on the first semiconductor device 210 and the second semiconductor device 220 may be combined by adhesive bonding, or by other similar methods, to form the SiP 200 shown in FIG. 2. Alternately, and in another particular embodiment, the first semiconductor device 210 and the second semiconductor device 220 may be combined to form the SiP 200 by a low temperature covalent bonding process as disclosed in U.S. Pat. No. 6,563,133 B1 to Tong, entitled "Method of Epitaxial-Like Wafer Bonding at Low Temperature and Bonded Structure", which is incorporated by reference herein.

The pads 212 and 214 of the first semiconductor device 210 and the pads 222 and 224 of the second semiconductor device 220 may be formed on the devices 210 and 220 by a variety of well-known methods. For example, the pads 212 and 214, and the pads 222 and 224 may be formed by depositing a layer of a dielectric material onto the first device 210 and the second device 220, masking the dielectric layers on the devices 210 and 220 and then selectively etching the dielectric layers to form recesses in the dielectric layers. A conductive material may then be deposited into the recesses to form the pads 212 and 214, and the pads 222 and 224. The pads 212, 214 and 222 and 224 may be appropriately sized to achieve a desired degree of capacitive coupling. For example, and in one particular embodiment, the pads 212, 214, 222 and 224 have a width $d_1$ of approximately about 30 μm. Further, the transmitters 102 and the receivers 104 may be positioned remotely from the pads 212 and 214 and the pads 222 and 224, respectively, as shown in FIG. 2. The transmitters 102 may also be formed in the first semiconductor device 210 at a location that is proximate to the pads 212 and 214. For example, the transmitters 102 may be formed at a location that is laterally adjacent to the pads 212 and 214. Alternately, the transmitters 102 may be positioned directly below and adjacent to the pads 212 and 214. In a similar manner, the receivers 102 may also be positioned at a location proximate to the pads 222 and 224, which includes positioning the receivers 102 in positions laterally adjacent to the pads 222 and 224, or directly below the pads 222 and 224.

Figure 3:
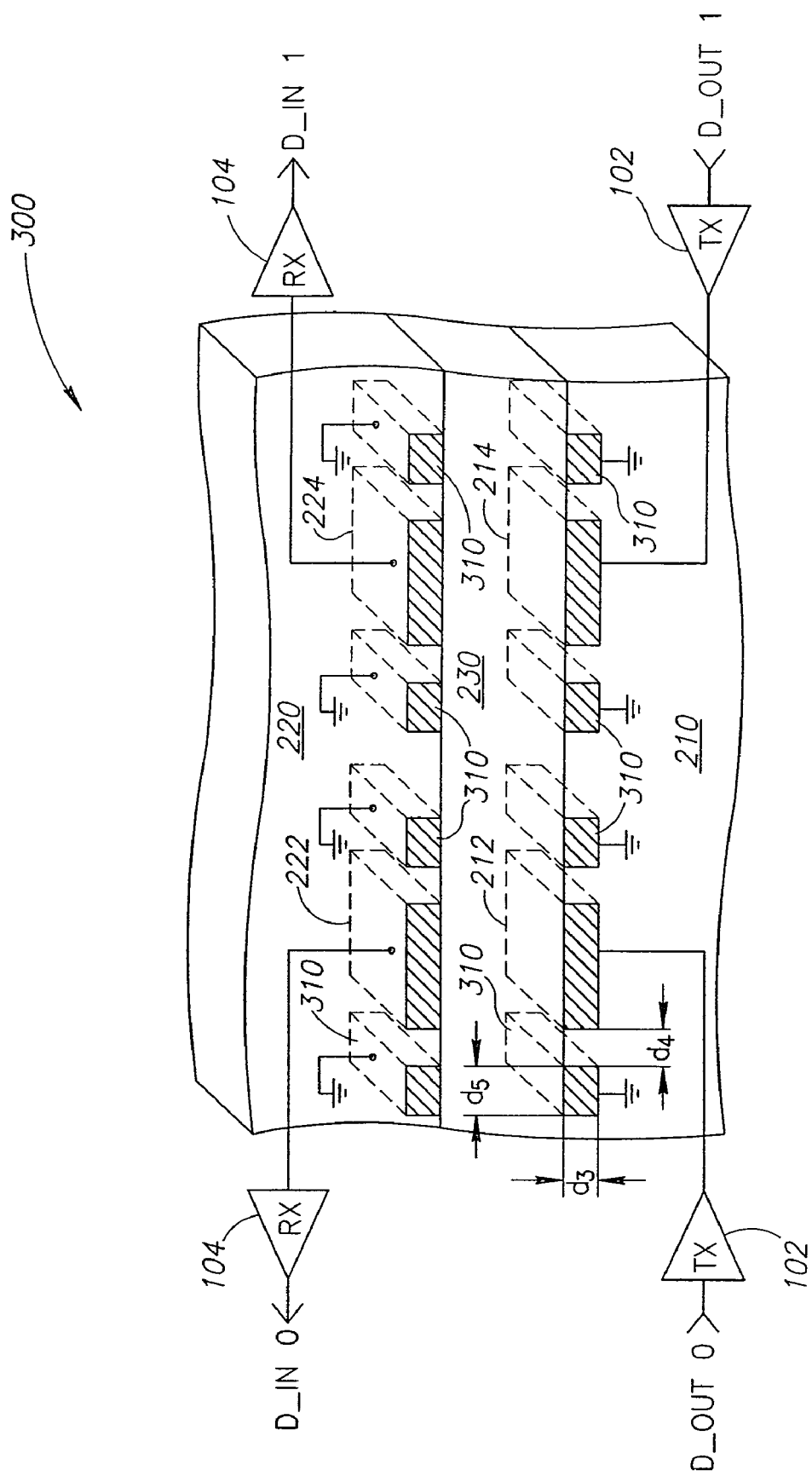
FIG. 3 is a partial isometric and cross-sectional view of a capacitively coupled SiP according to another embodiment of the invention.

FIG. 3 is a partial isometric and cross-sectional view of a capacitively coupled SiP 300 according to another embodiment of the invention. The SiP 300 includes first and second semiconductor devices 210 and 220, respectively, which are separated by the dielectric layer 230, as in the previous embodiment. The SiP 300 further includes guard rings 310 laterally spaced apart from the pads 212, 214, 222 and 224. Each of the guard rings 310 is coupled to ground to inhibit capacitive coupling between adjacent signal pads. Accordingly, the guard rings 310 may be formed in the first semiconductor device 210 so that the pads 212 and 214 are circumferentially enclosed by the guard rings 310. Alternately, the guard rings 310 may only partially enclose the pads 212 and 214, or extend along lateral edges of the pads 21 and 214, as shown in FIG. 3. Similarly, the guard rings 310 formed in the second semiconductor device 220 may circumferentially enclose the pads 222 and 224, or they may only partially enclose the pads 212 and 214, or extend along lateral edges of the pads 222 and 224, as described above. Although FIG. 3 shows guard rings 310 adjacent to each of the pads 212, 214, 222 and 224, one skilled in the art will appreciate that the guard rings 310 may formed adjacent to only a portion of the signal pads in the first semiconductor device 210 and the second semiconductor device 220, while other signal pads in the devices 210 and 220 are formed without adjacent guard rings 310. Further, the guard rings 310 may be formed in only one of the first semiconductor device 210 and the second semiconductor device 220.

Still referring to FIG. 3, the guard rings 310 may be formed in the exposed surfaces of the first semiconductor device 210 and the second semiconductor device 220 by a variety of well-known processes. For example, the guard rings 310 may be formed in the dielectric material deposited on the first device 210 and the second device 220 by masking the dielectric layer so that the layer may be selectively etched to form recesses in the dielectric layers. A conductive material may then be deposited into the recesses to form the guard rings 310. In one particular embodiment, the guard rings 310 may extend into the first and second devices 210 and 220 to a depth $d_3$ of approximately about 0.8 μm. In another particular embodiment, the guard rings 310 are spaced apart from the signal pads 212, 214, 222 and 224 by a distance $d_4$ of approximately about 2 μm. In still another particular embodiment, the guard rings 310 have a width $d_5$ of approximately about 2 μm.

Figure 4:
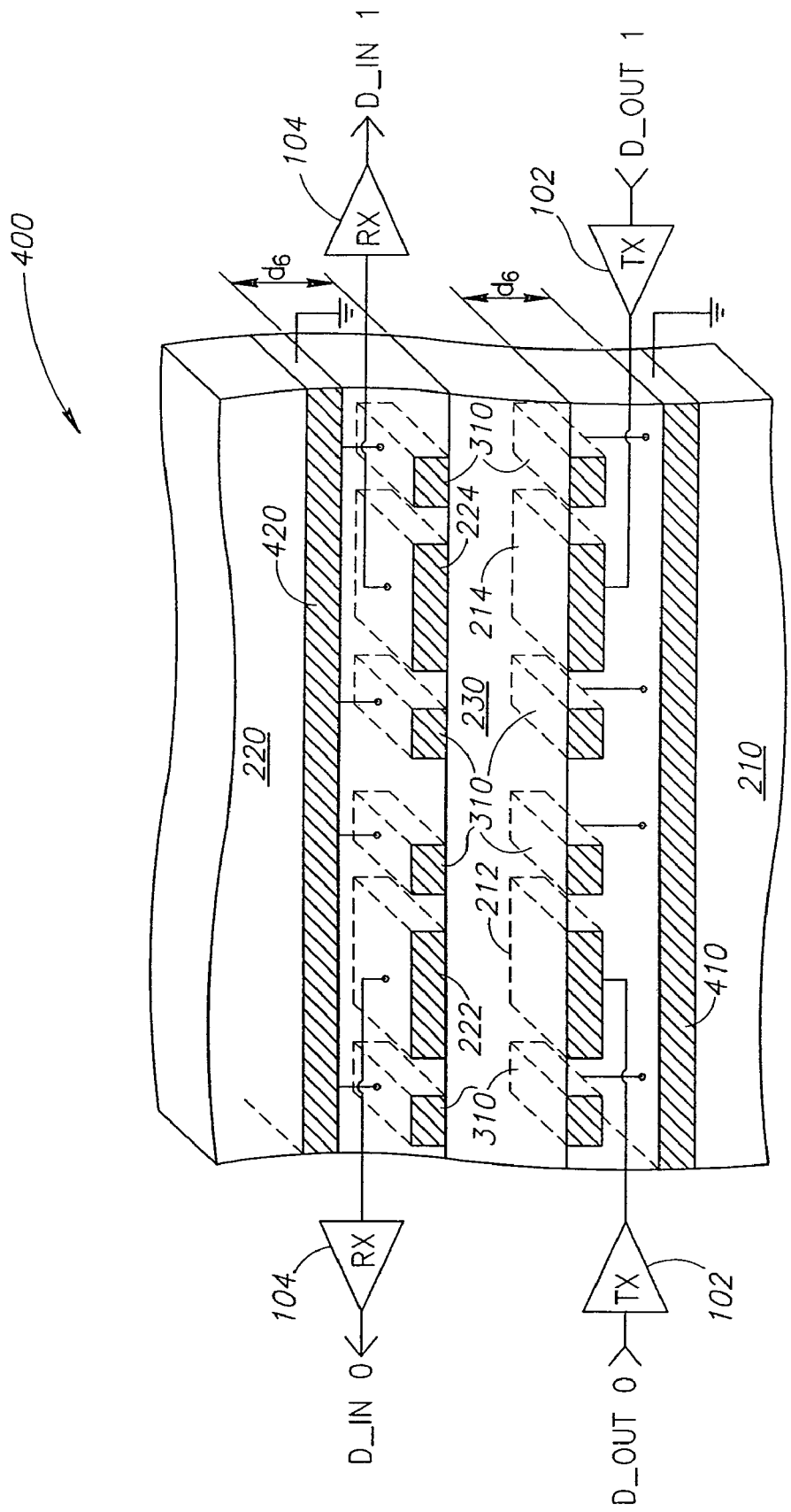
FIG. 4 is a partial isometric and cross-sectional view of a capacitively coupled SiP according to still another embodiment of the invention.

FIG. 4 is a partial isometric and cross-sectional view of a capacitively coupled SiP 400 according to still another embodiment of the invention. The SiP 400 includes first and second semiconductor devices 210 and 220 separated by the dielectric layer 230, as in embodiments described above. The SiP 400 further includes a first ground plane 410 positioned within the first semiconductor device 210 and spaced apart from the pads 212 and 214. The first ground plane 410 may be coupled to the guard rings 310 formed in the first semiconductor device 210 to provide a low impedance path to ground for the guard rings 310. The SiP 400 also includes a ground plane 420 positioned within the second semiconductor device 220 that is spaced apart from the pads 222 and 224. The second ground plane 420 may also be coupled to the guard rings 310 formed in the second semiconductor device 220. The first ground plane 410 and the second ground plane 420 may be formed from either metallic or non-metallic conductive materials, and may be formed within the first device 210 and the second device 220 by various well-known methods. For example, in a particular embodiment, the first ground plane 410 and the second ground plane 420 may be formed by depositing a layer of copper or aluminum on the first and second devices 210 and 220 during fabrication of the devices 210 and 220. Alternately, in another particular embodiment, a layer of heavily doped polycrystalline silicon may be formed within the devices 210 and 220 to form the ground planes 410 and 420. In still another particular embodiment, the first ground plane 410 and the second ground plane 420 are spaced apart from the respective surfaces of the first semiconductor device 210 and the second semiconductor device 220 by a distance $d_6$ of approximately about 1.90 μm.

The foregoing embodiments of the invention offer numerous advantages over the prior art. For example, the disclosed embodiments generally eliminate the need for electrostatic discharge (ESD) protection in the semiconductor devices comprising the SiP. Accordingly, the requirement to form additional devices, such as diodes or similar protective devices near the pads on a semiconductor device is eliminated, so that the device area, or "real estate" may be more efficiently utilized.

The foregoing embodiments also generally allow shorter signal paths to be established between the devices in the SiP. Accordingly, signal delay times are significantly reduced when compared to conventional wire bond or interposer coupling techniques. Undesirable parasitic effects are similarly reduced since the inductance associated with a wire bonding element is largely eliminated. Load requirements are also advantageously reduced since a relatively low capacitive load is present between the devices. As a result, the power requirement is significantly reduced in comparison to conventional packages, where the devices are required to drive signals off one device, and onto another device. The low capacitive load between the devices further advantageously permits relatively high bandwidth operation between the devices.

Still other advantages are evident in the foregoing embodiments. For example, since the devices are capacitively coupled, the devices may be operated at different D.C. voltage levels without the requirement for D.C. voltage isolation or D.C. level shifting between the devices. Since the foregoing pad, ground ring and ground plane structures are fabricated near the exterior layers of the devices, the structures may be conveniently formed in the devices by altering only the final steps in the fabrication procedure. Accordingly, the foregoing structures may be economically incorporated into the devices by altering relatively few semiconductor device masks.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:
1. A method of forming a device, the method comprising:
forming a first conductive signal pad on a surface of a first semiconductor device;
forming a second conductive signal pad on a surface of a second semiconductor device;

interposing a dielectric layer between the first semiconductor device and the second semiconductor device that separates the first conductive signal pad and the second conductive signal pad; and forming a guard ring in at least one of the first semiconductor device and the second semiconductor device, the guard ring being laterally spaced apart from at least one of the first conductive signal pad and the second conductive signal pad.

2. The method of claim 1, wherein interposing a dielectric layer further comprises passivating the surface of the first semiconductor device and the surface of the second semiconductor device.

3. The method of claim 2, wherein interposing a dielectric layer further comprises adhesively bonding the dielectric layer to the first semiconductor device and the second semiconductor device.

4. The method of claim 2, wherein interposing a dielectric layer further comprises combining the first semiconductor device and the second semiconductor device by a covalent bonding process.

5. The method of claim 1, further comprising positioning a ground plane adjacent to at least one of the first conductive signal pad and the second conductive signal pad; and coupling the ground plane to the guard ring.

6. The method of claim 1, further comprising coupling a transmitter to the first conductive signal pad and coupling a receiver to the second conductive signal pad.

7. The method of claim 6, further comprising forming the transmitter laterally adjacent to the first conductive signal pad and forming the receiver laterally adjacent to the second conductive signal pad.

8. The method of claim 6, further comprising forming the transmitter below the first conductive signal pad and forming the receiver below the second conductive signal pad.

9. The method of claim 1, further comprising:
masking respective surfaces of the first semiconductor device and the second semiconductor device;
forming recesses in the respective surfaces; and
depositing a conductive material into the recesses.

10. The method of claim 9, wherein masking respective surfaces further comprises applying a photoresist material to the respective surfaces, exposing the photoresist to radiation of a selected wavelength, and developing the photoresist.

11. A method of forming a device, the method comprising:
forming a layer of dielectric material having opposed first and second surfaces;
forming a first conductive signal pad on a surface of a first semiconductor device, the first conductive signal pad being in contact with the dielectric material adjacent the first surface of the layer of dielectric material;
forming a second conductive signal pad on a surface of a second semiconductor device, the second conductive signal pad being in contact with the dielectric material adjacent the second surface of the layer of dielectric material, the second conductive signal pad being adjacent to the first conductive signal pad to capacitively couple signals to the first conductive signal pad, the second conductive signal pad having substantially the same dimensions as the first conductive pad;
forming a guard ring adjacent to at least one of the first conductive signal pad and the second conductive signal pad that is coupled to a ground potential.

12. The method of claim 11, further comprising:
forming a transmitter in the first semiconductor substrate that is coupled to the first conductive signal pad; and
forming a receiver in the second semiconductor substrate that is coupled to the second conductive signal pad.

13. The method of claim 12, wherein forming a transmitter in the first semiconductor substrate comprises forming the transmitter at a position laterally adjacent to the first conductive signal pad; and forming a receiver in the second semiconductor substrate comprises forming the receiver at a position laterally adjacent to the second conductive signal pad.

14. The method of claim 12, wherein forming a transmitter in the first semiconductor substrate comprises forming the transmitter at a location below the first conductive signal pad; and forming a receiver in the second semiconductor substrate comprises forming the receiver at a location below the second conductive signal pad.

15. The method of claim 11, wherein forming a layer of dielectric material having opposed first and second surfaces comprises forming a layer of silicon dioxide.

16. The method of claim 11, wherein forming a layer of dielectric material having opposed first and second surfaces comprises forming a layer of silicon nitride.

17. The method of claim 11, wherein forming a guard ring adjacent to at least one of the first conductive signal pad and the second conductive signal pad further comprises forming a guard ring that substantially circumferentially surrounds at least one of the first conductive signal pad and the second conductive signal pad.

18. A method of forming a device, the method comprising:
forming a layer of dielectric material having opposed first and second surfaces;
forming a first conductive signal pad on a surface of a first semiconductor device, the first conductive signal pad being in contact with the dielectric material adjacent the first surface of the layer of dielectric material;
forming a second conductive signal pad on a surface of a second semiconductor device, the second conductive signal pad being in contact with the dielectric material adjacent the second surface of the layer of dielectric material, the second conductive signal pad being adjacent to the first conductive signal pad to capacitively couple signals to the first conductive signal pad, the second conductive signal pad having substantially the same dimensions as the first conductive pad; and
forming a ground plane adjacent to at least one of the first conductive signal pad and the second conductive signal pad that is coupled to a ground potential.

19. A method of forming a device, the method comprising:
forming a first conductive signal pad on a surface of a first semiconductor device,
forming a first dielectric layer on the surface of the first semiconductor device;
forming a second conductive signal pad on a surface of a second semiconductor device;
forming a second dielectric layer on the surface of the second semiconductor device;
bonding the first dielectric layer to the second dielectric layer so that the first conductive signal pad is operable to capacitively couple signals to the second conductive signal pad; and
forming at least one guard ring in at least one of the first dielectric layer adjacent the first conductive signal pad or the second dielectric layer adjacent the second conductive signal pad.

20. The method of claim 19 wherein the bonding is by adhesive bonding or covalent bonding.

21. The method of claim 19 further comprising:
positioning a ground plane adjacent to at least one of the first conductive signal pad and the second conductive signal pad; and
coupling the ground plane to a guard ring.

22. A method of forming a device, the method comprising
forming a first conductive signal pad on a surface of a first semiconductor device;
forming a first dielectric layer on the surface of the first semiconductor device;
forming a second conductive signal pad on a surface of a second semiconductor device;
forming a second dielectric layer on the surface of the second semiconductor device;
bonding the first dielectric layer to the second dielectric layer so that the first conductive signal pad is operable to capacitively couple signals to the second conductive signal pad; and
forming at least one guard ring in at least one of the first semiconductor device adjacent the first conductive signal pad or the second semiconductor device adjacent the second conductive signal pad.

* * * * *

UNITED STATES PATENT AND TRADEMARK OFFICE
CERTIFICATE OF CORRECTION

PATENT NO. : 7,763,497 B2 Page 1 of 1
APPLICATION NO. : 12/323213
DATED : July 27, 2010
INVENTOR(S) : Philip Neaves It is certified that error appears in the above-identified patent and that said Letters Patent is hereby corrected as shown below:

In column 7, line 61, in Claim 11, delete "pad;" and insert -- pad; and --, therefor.

Signed and Sealed this

Twenty-first Day of September, 2010

David J. Kappos
*Director of the United States Patent and Trademark Office*